United States Patent
Yoshida

(10) Patent No.: US 10,864,663 B2
(45) Date of Patent: *Dec. 15, 2020

(54) IMPRINT APPARATUS AND METHOD OF DETECTING PEELING DEFECT IN THE SAME

(71) Applicant: Samsung Display Co., Ltd., Yongin-si (KR)

(72) Inventor: Futoshi Yoshida, Suwon-si (KR)

(73) Assignee: Samsung Display Co., Ltd., Yongin-si (KR)

(*) Notice: Subject to any disclaimer, the term of this patent is extended or adjusted under 35 U.S.C. 154(b) by 341 days.

This patent is subject to a terminal disclaimer.

(21) Appl. No.: 15/923,915

(22) Filed: Mar. 16, 2018

(65) Prior Publication Data

US 2018/0281245 A1    Oct. 4, 2018

(30) Foreign Application Priority Data

Mar. 31, 2017  (KR) .......................... 10-2017-0041945

(51) Int. Cl.
| | |
|---|---|
| *B29C 43/50* | (2006.01) |
| *B29C 43/18* | (2006.01) |
| *B29C 43/58* | (2006.01) |
| *G02B 5/30* | (2006.01) |
| *G03F 7/00* | (2006.01) |
| *B29L 31/34* | (2006.01) |
| *B29L 11/00* | (2006.01) |

(52) U.S. Cl.
CPC .............. *B29C 43/50* (2013.01); *B29C 43/18* (2013.01); *B29C 43/58* (2013.01); *G02B 5/3033* (2013.01); *G03F 7/0002* (2013.01); *B29C 2043/5084* (2013.01); *B29C 2043/585* (2013.01); *B29C 2043/5808* (2013.01); *B29L 2011/0066* (2013.01); *B29L 2031/3475* (2013.01); *G02B 2207/101* (2013.01)

(58) Field of Classification Search
CPC .... B29C 2043/5076; B29C 2043/5808; B29C 2043/585
See application file for complete search history.

(56) References Cited

U.S. PATENT DOCUMENTS

| | | | |
|---|---|---|---|
| 10,431,456 B2 * | 10/2019 | Yoshida | B65H 27/00 242/419.1 |
| 2008/0224389 A1 * | 9/2008 | Saito | B65H 7/06 271/256 |
| 2018/0022563 A1 * | 1/2018 | Liang | B65H 27/00 242/419.1 |

FOREIGN PATENT DOCUMENTS

| | | |
|---|---|---|
| JP | 2011-114309 A | 6/2011 |
| KR | 10-1638070 | 7/2016 |

* cited by examiner

*Primary Examiner* — Xiao S Zhao
*Assistant Examiner* — John J Derusso
(74) *Attorney, Agent, or Firm* — Lewis Roca Rothgerber Christie LLP

(57) ABSTRACT

An imprint apparatus includes: a pressure roller configured to press a film onto a substrate; an idle roller spaced from the pressure roller, the idle roller and pressure roller being configured to peel the film from the substrate; a pressure sensor connected to the pressure roller and configured to sense a first pressure applied to the pressure roller; and a controller configured to detect a peeling defect based on the first pressure.

14 Claims, 8 Drawing Sheets

IMPRINT APPARATUS AND METHOD OF DETECTING PEELING DEFECT IN THE SAME

CROSS-REFERENCE TO RELATED APPLICATION

This application claims priority to and the benefit of Korean Patent Applications No. 10-2017-0041945, filed on Mar. 31, 2017 in the Korean Intellectual Property Office (KIPO), the entire content of which is incorporated herein by reference.

BACKGROUND

1. Field

Example embodiments of the present invention relate generally to an imprint apparatus and a method of detecting a peeling defect in the imprint apparatus.

2. Description of the Related Art

There is a demand to form a polarizer on a substrate of increasingly thin display devices. Generally, a fine pattern (e.g., a nanometer size pattern) is formed on the substrate to form the polarizer. Such a process may include forming (or providing) a photo-curable resin or a thermosetting resin on the substrate, pressing a mold (or stamp film) having a pattern on the resin-formed substrate, curing the resin-formed substrate by heat or ultraviolet light, and separating the mold and the substrate to transfer the pattern to the substrate.

The fine pattern should be uniformly formed to manufacture a large-scale display device. Defects in the fine pattern can be detected by capturing an image of the resin-formed substrate using a CCD camera after the resin is formed on the substrate or by capturing an image of the pattern-formed substrate using the CCD camera. However, the method of detecting defects using a CCD camera may have disadvantages, such that it may be difficult to precisely check the quality of a nano-sized pattern.

SUMMARY

Some example embodiments provide an imprint apparatus capable of detecting defects in a fine pattern.

Some example embodiments provide a method of detecting a peeling defect in the imprint apparatus.

According to an example embodiment, an imprint apparatus includes a pressure roller configured to press a film onto a substrate, an idle roller spaced from the pressure roller, the idle roller and the pressure roller being configured to peel the film from the substrate, a pressure sensor connected to the pressure roller and configured to sense a first pressure applied to the pressure roller, and a controller configured to detect a peeling defect based on the first pressure.

In example embodiments, the controller may detect the peeling defect by comparing the first pressure with a resultant force of a second pressure and a third pressure. The second pressure may be a pressure with which the pressure roller presses the film in a first direction, and the third pressure may be a pressure with which a tension of the film is applied to the pressure roller in the first direction.

In example embodiments, the controller may be configured to decrease a peeling speed of the film when the peeling defect is detected.

In example embodiments, the controller may be configured to adjust at least one of a peeling angle at which the film is peeled from the substrate and a tension of the film based on a peeling defect detection level.

In example embodiments, the idle roller may move in at least one of a first direction and a second direction orthogonal to the first direction to adjust the peeling angle.

In example embodiments, the pressure roller and the idle roller may be configured to concurrently move such that a distance between the pressure roller and the idle roller is constantly maintained while the film is peeled from the substrate.

In example embodiments, the imprint apparatus may further include a film supply roller configured to supply the film to the pressure roller, a film recovery roller configured to recover the film from the idle roller, and a tensioner between the idle roller and the film recovery roller. The tensioner may be configured to control a tension of the film.

According to another example embodiment, an imprint apparatus includes a pressing portion including a pressure roller configured to press a film onto a substrate, a pressure sensor connected to the pressure roller and configured to sense a first pressure applied to the pressure roller, an idle portion configured to move to adjust a peeling angle at which the film is peeled from the substrate, a tensioner configured to control a tension of the film, and a controller configured to detect a peeling defect based on the first pressure.

In example embodiments, the pressing portion may further include a first roller support member configured to support the pressure roller and a first actuator configured to control the pressure roller such that the pressure roller presses the film in a first direction with a second pressure. The pressure sensor may be between the first roller support member and the first actuator.

In example embodiments, the controller may be configured to detect the peeling defect by comparing the first pressure with a resultant force of the second pressure and a third pressure. The third pressure may be a pressure with which the tension of the film is applied to the pressure roller in the first direction.

In example embodiments, the controller may be configured to decrease a peeling speed of the film when the peeling defect is detected.

In example embodiments, at least one of the peeling angle and the tension of the film may be adjusted based on a peeling defect detection level.

In example embodiments, the idle portion may include an idle roller spaced from the pressure roller and configured to peel the film from the substrate, and a second actuator configured to move the idle roller in at least one of a first direction and a second direction orthogonal to the first direction to adjust the peeling angle.

In example embodiments, the pressure roller and the idle roller may be configured to be concurrently moved such that a distance between the pressure roller and the idle roller may be maintained while the film is peeled from the substrate.

According to another example embodiment, a method of detecting a peeling defect in an imprint apparatus for forming a fine pattern on a substrate corresponding to a pattern of a film by transferring the pattern of the film onto the substrate on which a resin is formed is provided. The method includes pressing the film onto the substrate on which the resin is provided, curing the resin, moving a pressure roller and an idle roller to peel the film from the substrate, and detecting a peeling defect based on a first pressure of the pressure roller.

In example embodiments, the peeling defect may be detected by comparing the first pressure with a resultant force of a second pressure and a third pressure. The second pressure may be a pressure with which the pressure roller presses the film in a first direction, and the third pressure may be a pressure with which a tension of the film is applied to the pressure roller in the first direction.

In example embodiments, the method may further include decreasing a peeling speed of the film when the peeling defect is detected.

In example embodiments, the method may further include adjusting at least one of a peeling angle at which the film is peeled from the substrate and a tension of the film based on a peeling defect detection level.

In example embodiments, the peeling angle may be adjusted by moving the idle roller in at least one of a first direction and a second direction orthogonal to the first direction.

In example embodiments, the pressure roller and the idle roller may be concurrently moved such that a distance between the pressure roller and the idle roller may be maintained while the film is peeled from the substrate.

The imprint apparatus according to example embodiments determines whether or not a peeling force of the film exceeds a peeling force limit value by using a pressure sensor sensing a first pressure of the pressure roller to detect a peeling defect. Therefore, defects in the imprint process (e.g., defects in the fine patterns formed on the substrate) can be efficiently detected. In addition, the imprint apparatus may set the peeling defect detection level in accordance with an imprint process characteristic or change (e.g., change of materials, structures, etc.) and may adjust the peeling angle at which the film is peeled from the substrate and/or a tension of the film based on the peeling defect detection level, thereby increasing the utilization of the imprint apparatus.

In a method of detecting a peeling defect in the imprint apparatus according to example embodiments, the imprint quality may be inspected by a simple method using only a pressure sensor without additional equipment, such as a CCD camera or a microscope. Accordingly, the efficiency of the manufacturing process can be improved.

BRIEF DESCRIPTION OF THE DRAWINGS

Illustrative, non-limiting example embodiments will be more clearly understood from the following detailed description taken in conjunction with the accompanying drawings, in which.

DETAILED DESCRIPTION

Figure 1:
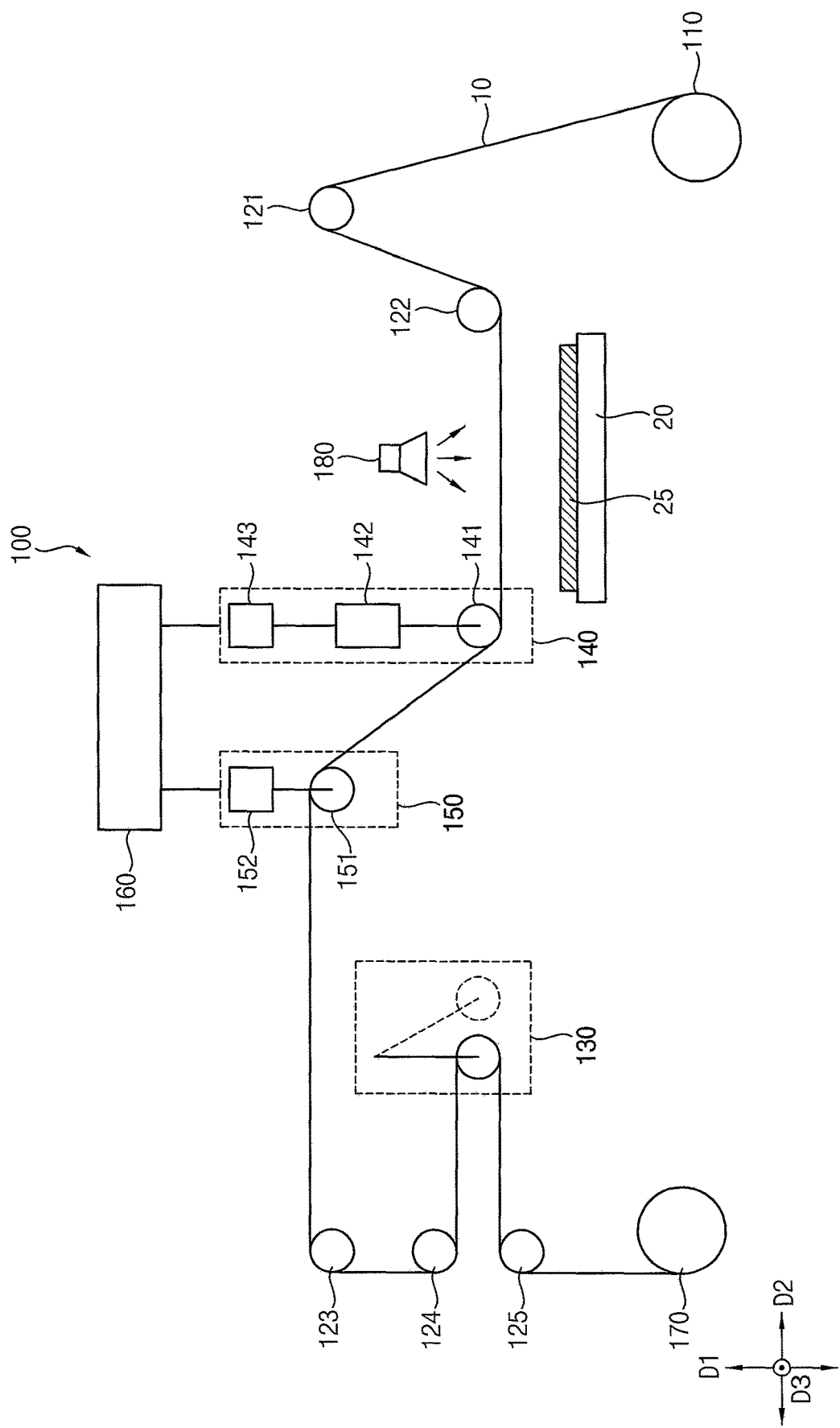
FIG. 1 is a diagram illustrating an imprint apparatus according to example embodiments.

Exemplary embodiments will be described more fully hereinafter with reference to the accompanying drawings, in which various embodiments are shown.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. The same reference numerals designate the same elements. As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments. In the figures, dimensions of the various elements, layers, etc. may be exaggerated for clarity of illustration.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

The controller and/or any other relevant devices or components according to embodiments of the present invention described herein may be implemented utilizing any suitable hardware, firmware (e.g., an application-specific integrated circuit), software, and/or a suitable combination of software, firmware, and hardware. For example, the various components of the controller may be formed on one integrated circuit (IC) chip or on separate IC chips. Further, the various components of the controller may be implemented on a flexible printed circuit film, a tape carrier package (TCP), a printed circuit board (PCB), or formed on a same substrate as the controller. Further, the various components of the controller may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device or the functionality of a particular computing device may be distributed across one or more other computing devices without departing from the scope of the exemplary embodiments of the present invention.

FIG. 1 is a diagram illustrating an imprint apparatus according to example embodiments.

Referring to FIG. 1, the imprint apparatus 100 may include a film supply roller 110, rollers 121-125, a tensioner 130, a pressing portion 140, an idle portion 150, a controller 160, a film recovery roller 170, and an ultraviolet lamp 180.

The film supply roller 110 may supply a film 10 to a pressure roller 141 of the pressing portion 140. The film recovery roller 170 may recover the film 10 from an idle roller 151 of the idle portion 150. The film supply roller 110 and the film recovery roller 170 may be spaced from (e.g., spaced apart from) each other to wind or rewind the film 10. Accordingly, the film supply roller 110 and the film recovery roller 170 control the movement of the film 10 such that an imprint process is performed between the film supply roller 110 and the film recovery roller 170. The plurality of rollers 121-125 may be located between the film supply roller 110 and the film recovery roller 170 and may support the film 10. In some embodiments, the film 10 may be a polymer film, such as polyethylene terephthalate (PET), poly carbonate (PC), polyethylene naphthalene (PEN), or polyimide (PI), or a material including a thin glass, metal, etc. The film 10 may include a pattern for forming a fine pattern on a substrate 20 on which a resin 25 is formed. For example, the pattern may be formed at regular intervals on a surface of the film 10 facing the substrate 20.

The tensioner 130 may be located between the idle roller 151 and the film recovery roller 170. The tensioner 130 may control (or adjust) a tension of the film 10. The tensioner 130 may control the tension of the film 10 based on a peeling defect detection level. The tensioner 130 may constantly or substantially constantly maintain the tension of the film 10 to maintain an angle between the film 10 and the substrate 20 while the film 10 is pressed on the substrate 20 and while the film 10 is peeled from the substrate 20. For example, the tensioner 130 may include an electric actuator that pulls the film 10 from the film supply roller 110 to the film recovery roller 170.

The pressing portion 140 may press the film 10 and may sense a pressure of the pressure roller 141. In one example embodiment, the pressing portion 140 may include the pressure roller 141, a pressure sensor 142, and a first actuator 143. The pressure roller 141 may press the film 10 such that the film 10 having the pattern is pressed on the substrate 20 on which the resin 25 is formed (or provided). The first actuator 143 may control the pressure roller 141 such that the pressure roller 141 presses the film 10 in the first direction D1 with a second pressure. The pressure sensor 142 may be located between the pressure roller 141 and the first actuator 143. The pressure sensor 142 may sense a first pressure applied to the pressure roller 141 in the first direction D1.

The idle portion 150 may include the idle roller 151 and a second actuator 152. The idle roller 151 may be spaced from (e.g., spaced apart from) the pressure roller 141 such that the film 10 is peeled from the substrate 20. The second actuator 152 may move the idle roller 151. The idle roller 151 may move in the second direction D2 integrally with the pressure roller 141 such that the film 10 is peeled from the substrate 20 at a constant or substantially constant peeling angle (e.g., the idle roller 151 and the pressure roller 141 may move as a single unit). In one example embodiment, the idle roller 151 may move to adjust the peeling angle. Thus, the idle roller 151 may move in the first direction D1 and/or the second direction D2 to set the peeling angle determined based on the peeling defect detection level.

The controller 160 may determine whether or not a peeling force between the film 10 and the substrate 20 exceeds a peeling force limit value and may detect a peeling defect based on the first pressure. Here, the peeling force represents a minimum force with which the film 10 is pulled in a direction perpendicular to the substrate 20 to peel the film 10 from the substrate 20. The peeling force limit value represents a value determined by the peeling force at which the defect does not occur (i.e., the peeling defect detection level). Because the peeling force is smaller than the peeling defect detection level in a state in which the film 10 is normally peeled from the substrate 20 (i.e., in a normal state), the film 10 is partially wound on the pressure roller 141 while the film 10 is peeled from the substrate 20 in the normal state. Therefore, the first pressure of the pressure roller 141 sensed by the pressure sensor 142 may correspond to a resultant force of the second pressure and a third pressure in the normal state. The second pressure may be a pressing force that the first actuator 143 presses the pressure roller 141 in the first direction D1. The third pressure may be a force that the tension of the film 10 applies to the pressure roller 141 in the first direction D1. The peeling force may be greater than the peeling defect detection level in a state in which the film 10 is abnormally peeled from the substrate 20 (i.e., in an abnormal state). In the abnormal state, the film 10 may not be wound on the pressure roller 141, for example, the film 10 may be peeled from the substrate 20 at a position spaced from the pressure roller 141. Therefore, in the abnormal state, because the tension of the film 10 in the first direction D1 does not reach or affect the pressure roller 141, the first pressure of the pressure roller 141 sensed by the pressure sensor 142 may deviate from the error range of the resultant force. Accordingly, the controller 160 detects the peeling defect based on the sensed first pressure and monitors whether or not the imprint process is normally performed. A method of detecting the peeling defect based on the first pressure will be described in detail below with reference to FIGS. 9 and 10.

The controller 160 may set the peeling defect detection level and may adjust a peeling angle at which the film 10 is peeled from the substrate 20 and/or the tension of the film 10 based on the peeling defect detection level. When the peeling defect detection level is set to a relatively low value, the peeling defect may be inspected (e.g., strictly inspected) to secure high quality. When the peeling defect detection level is set to a relatively high value, the peeling defect may be inspected flexibly and may increase a process yield. Therefore, the imprint apparatus 100 may set the peeling defect detection level in consideration of an imprint process material, a quality requirement level, etc. Accordingly, the imprint process can be performed flexibly. A method of setting the peeling defect detection level and controlling the peeling angle and/or the tension of the film will be described in more detail with reference to FIGS. 5-8.

In addition, the controller 160 may control operations of the imprint process when a peeling defect is detected. In one example embodiment, the controller 160 may decrease a peeling speed of the film 10 when the peeling defect is detected. For example, the peeling force (or adhesion force) between the film 10 and the substrate 20 may be affected by the peeling speed. As the peeling speed increases, more defects may occur in the fine pattern transferred to the substrate 20 due to, for example, cracks generated in the patterns of the film 10. Accordingly, the controller 160 may control a moving speed of the pressing portion 140 and the idle portion 150 to lower the peeling speed of the film 10 when the peeling defect is detected. Further, when the peeling defect is continuously or repeatedly detected while the pressure roller 141 is moved over a distance (e.g., over a predetermined distance), the controller 160 may determine that an error occurs in the imprint process and may stop the operation of the imprint apparatus 100.

The ultraviolet lamp 180 may irradiate the substrate 20 with ultraviolet light. The ultraviolet lamp 180 may cure the photo-curable resin 25 by irradiating the substrate 20 on which the photo-curable resin 25 is formed with ultraviolet light after the film 10 is pressed on the substrate 20.

Therefore, the imprint apparatus 100 can precisely inspect the quality of a nano-sized fine pattern by monitoring the imprint process based on the peeling force between the film 10 and the substrate 20 (e.g., by detecting the abnormal peeling force).

Although the example embodiments of FIG. 1 describe that the imprint apparatus 100 uses the film 10 including the pattern formed outside of the imprint apparatus 100 (e.g., the film 10 may include a pre-formed pattern), the imprint apparatus 100 may further include a device for forming the pattern on the film inside of the imprint apparatus 100 (e.g., between the pressing portion 140 and the film supply roller 110).

Figure 2:
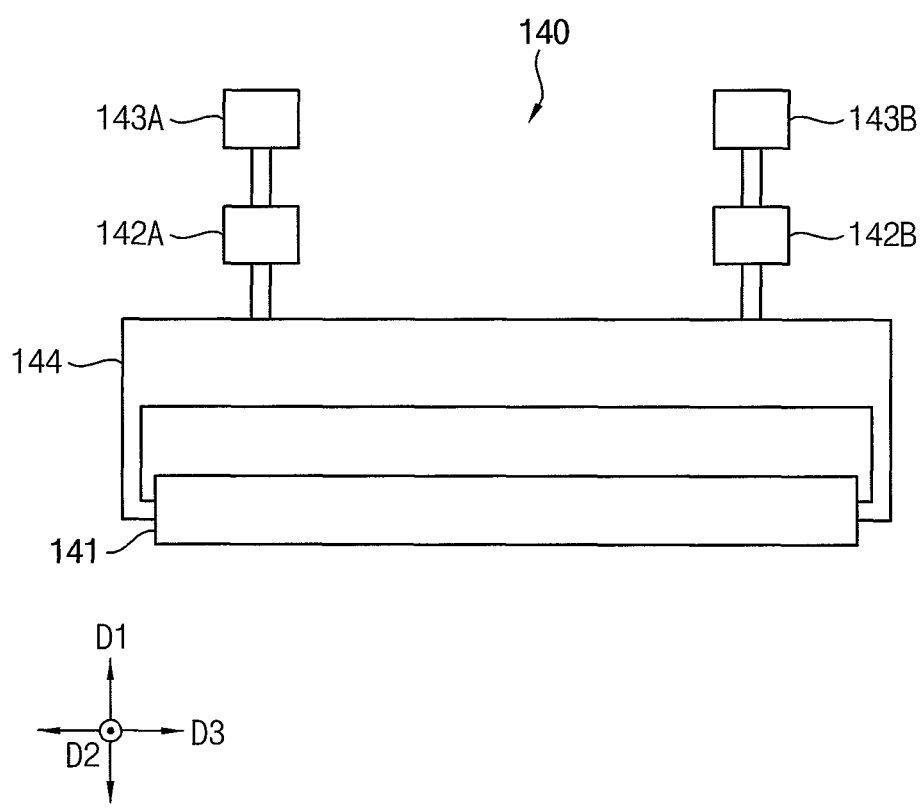
FIG. 2 is a diagram illustrating an example of a pressing portion included in the imprint apparatus shown in FIG. 1.

FIG. 2 is a diagram illustrating an example of a pressing portion included in the imprint apparatus of FIG. 1.

Referring to FIG. 2, the pressing portion 140 may have various structures for sensing the first pressure applied to the pressure roller 141 in the first direction D1 using pressure sensors. In one example embodiment, the pressing portion 140 may include a pressure roller 141, a first roller support member 144, one or more pressure sensors, and one or more first actuators. The pressing portion 140 may include a plurality of pressure sensors 142A, 142B and a plurality of first actuators 143A, 143B, each of which are arranged in a third direction D3 such that the pressing portion 140 is stably moved.

The first roller support member 144 may be connected to both ends of the pressure roller 141 to stably support the pressure roller 141.

The pressure sensors 142A, 142B may be disposed between the first roller support member 144 and the first actuators 143A, 143B. The pressure sensors 142A, 142B may sense the first pressure applied to the pressure roller 141 in the first direction D1.

The first actuators 143A, 143B may control the pressure roller 141 such that the pressure roller 141 presses the film in the first direction D1 with the second pressure. Thus, the first actuators 143A, 143B may press the pressure roller 141 and the first roller support member 144 through the pressure sensors 142A, 142B in the first direction D1 with the second pressure. In addition, the first actuators 143A, 143B may move the pressure roller 141 in the second direction D2 such that the film is peeled from the substrate.

Figure 3:
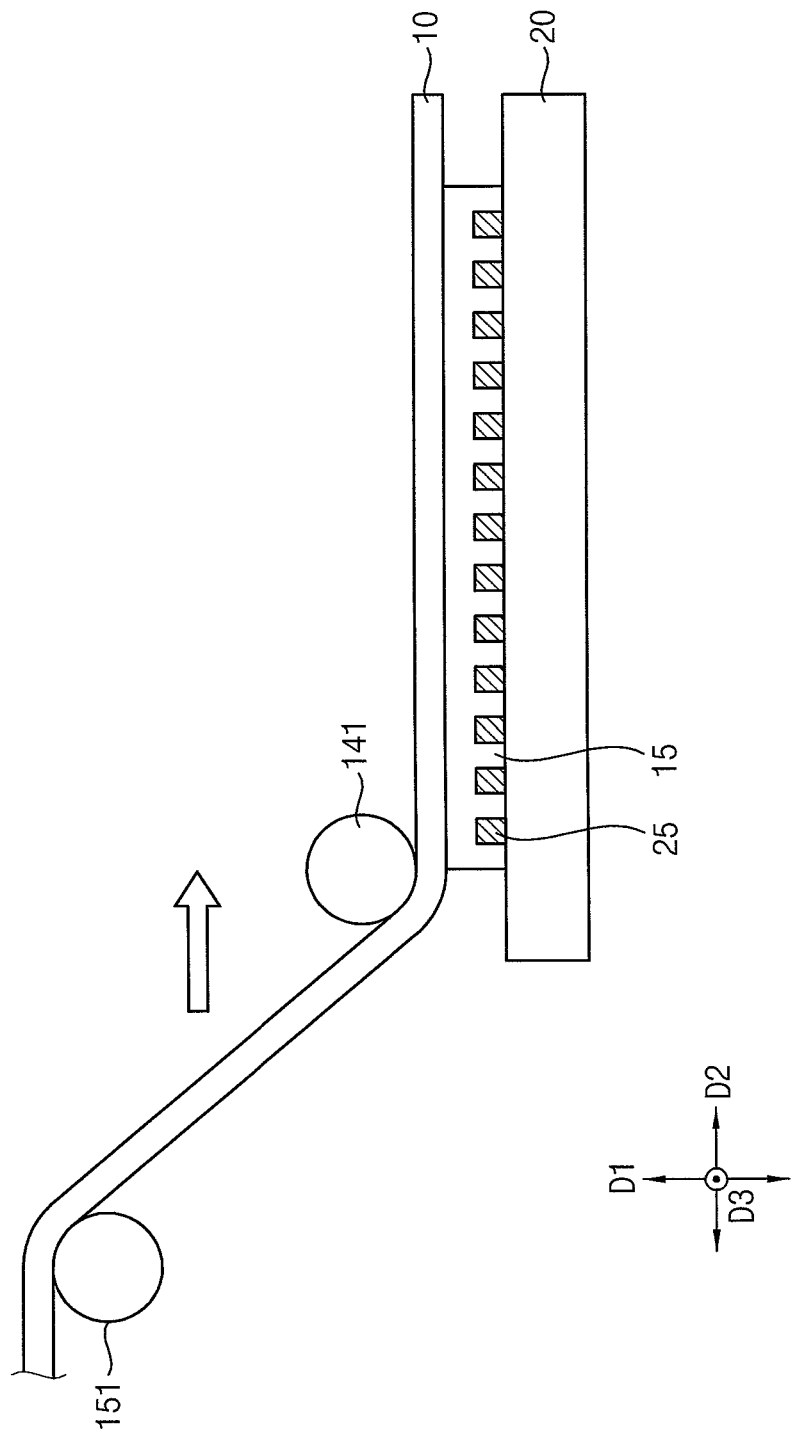
FIGS. 3 and 4 are diagrams illustrating an example in which a film is peeled by a pressure roller and an idle roller included in the imprint apparatus shown in FIG. 1.
Figure 4:
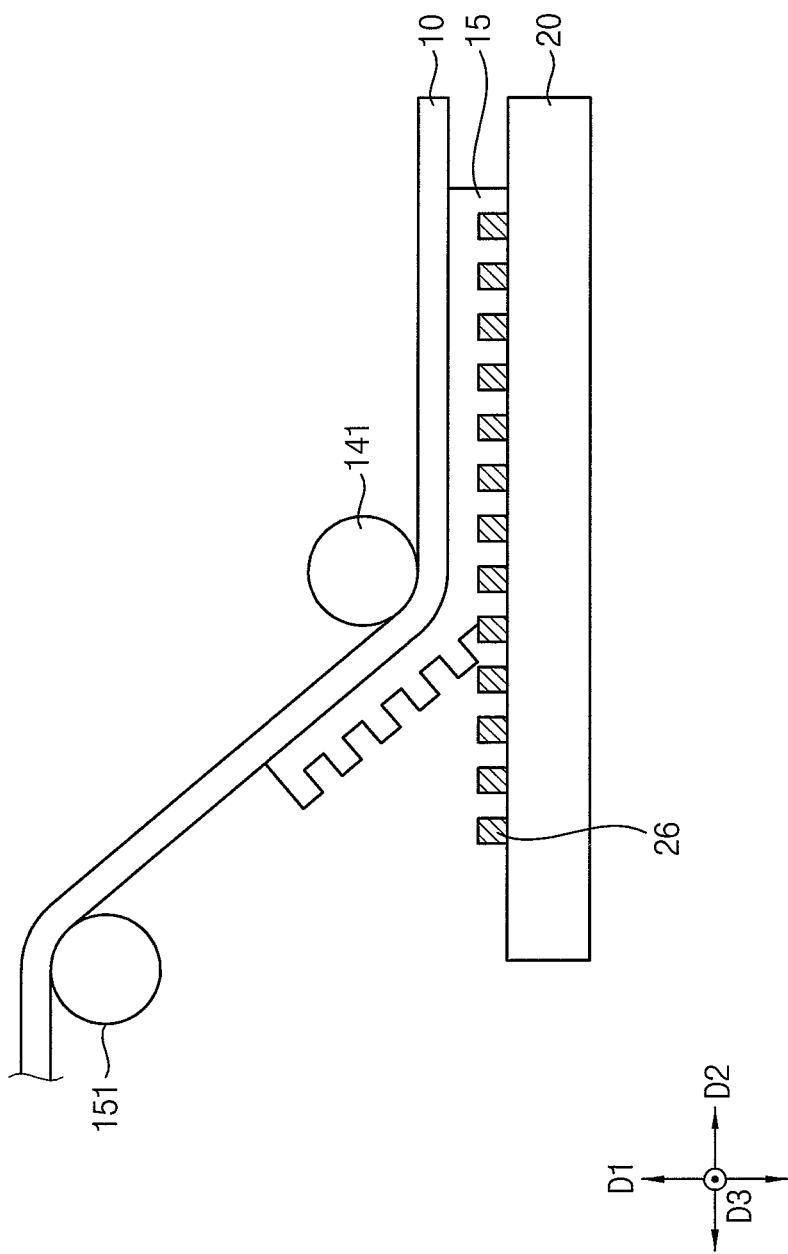

FIGS. 3 and 4 are diagrams illustrating an example in which a film is peeled by a pressure roller and an idle roller included in the imprint apparatus shown in FIG. 1.

Referring to FIGS. 3 and 4, the pressure roller 141 and the idle roller 151 may be moved such that the film 10 is peeled from the substrate 20.

As shown in FIG. 3, the film 10 including the pattern 15 may be pressed onto the substrate 20 on which the resin 25 is formed. In one example embodiment, the pressure roller 141 and a roller (e.g., the roller 122 shown in FIG. 1) supporting the film 10 may be concurrently, simultaneously, or sequentially moved in the first direction D1 such that the film 10 including the pattern 15 may be pressed on the substrate 20 on which the resin 25 is formed. In another example embodiment, the stage supporting the substrate 20 may be moved in the first direction D1 such that the film 10 is pressed on the substrate 20. After the film 10 is pressed on the substrate 20, the photo-curable resin 25 may be cured by ultraviolet light or the like. Accordingly, the resin 25 may be cured or hardened in a shape corresponding to the pattern 15, and a fine pattern can be formed.

As shown in FIG. 4, the pressure roller 141 and the idle roller 151 may be moved in the second direction D2 (i.e., in a direction parallel to a surface of the substrate) such that the film 10 is peeled from the substrate 20. In one example embodiment, the pressure roller 141 and the idle roller 151 may be concurrently (or simultaneously) moved while the film 10 is peeled from the substrate 20. A distance between the pressure roller 141 and the idle roller 151 may be constantly maintained while the film 10 is peeled from the substrate 20. For example, the pressure roller 141 and the idle roller 151 may be integrally moved such that the peeling angle at which the film 10 is peeled from the substrate 20 is kept constant. Accordingly, the fine pattern 26 generated on the substrate 20 may have a uniform quality.

Figure 5:
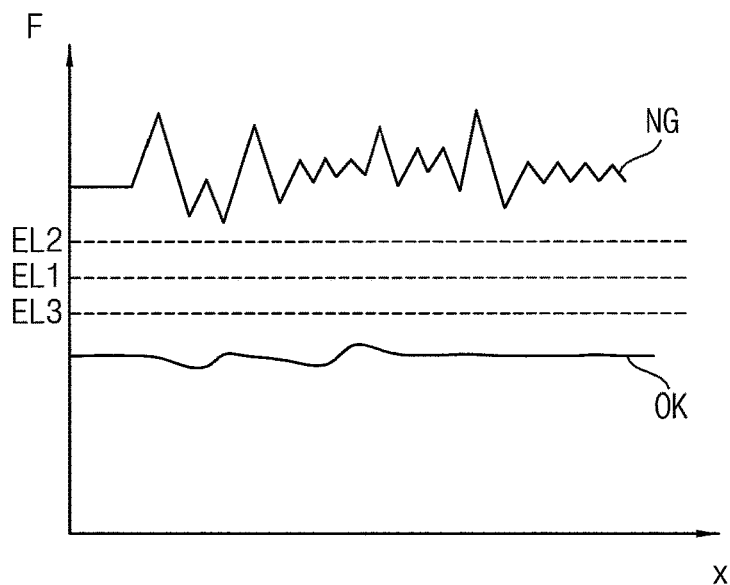
FIG. 5 is a diagram for describing a method of setting a peeling defect detection level.
Figure 6:
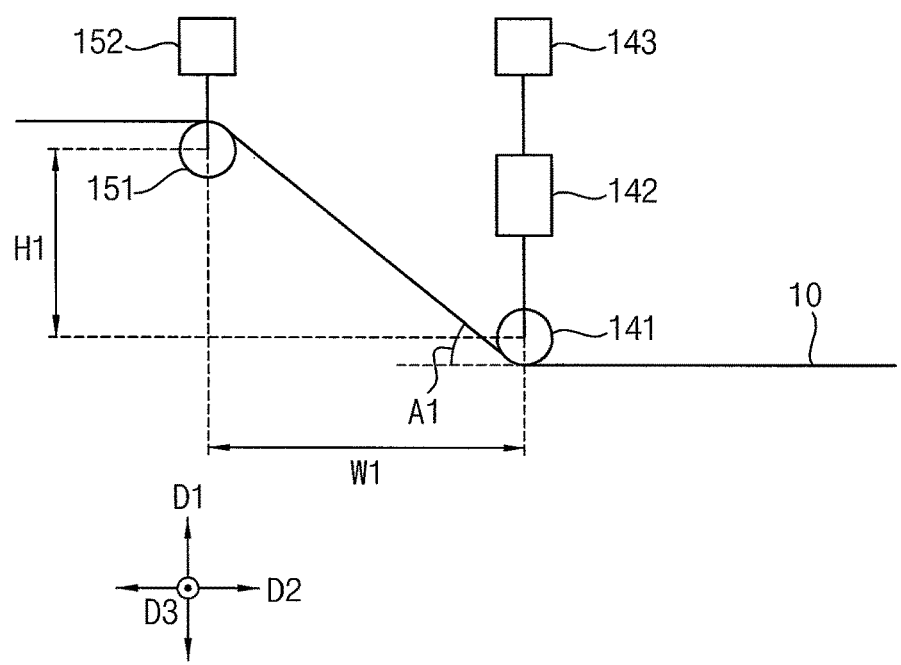
FIGS. 6-8 are diagrams for describing examples in which a peeling angle is adjusted according to a position of an idle roller included in the imprint apparatus shown in FIG. 1.
Figure 7:
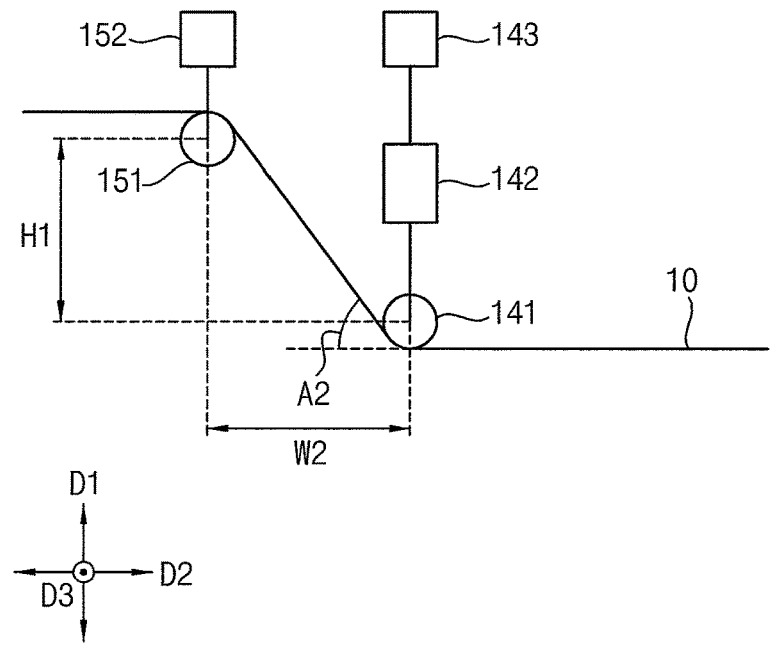
Figure 8:
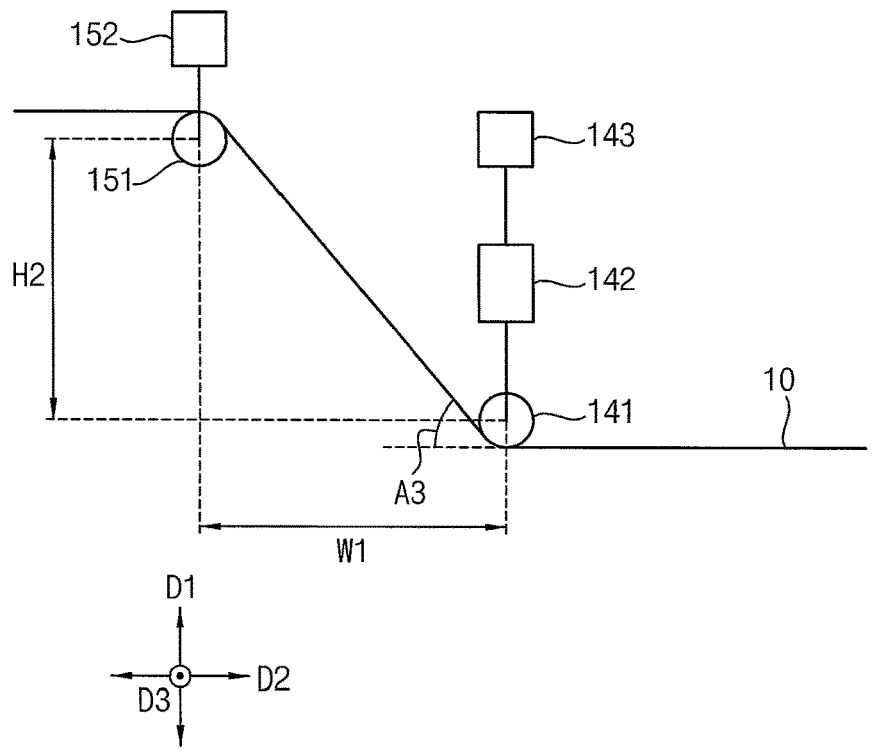

FIG. 5 is a diagram for describing a method of setting a peeling defect detection level. FIGS. 6-8 are diagrams for describing examples in which a peeling angle is adjusted according to a position of an idle roller included in the imprint apparatus shown in FIG. 1.

Referring to FIGS. 5-8, the imprint apparatus may set the peeling defect detection level (e.g., the peeling force limit value) and may control the peeling angle and/or the tension of the film based on the peeling defect detection level.

Accordingly, the imprint apparatus may detect the peeling defect flexibly in accordance with a change or characteristic of the imprint process (e.g., change of material, structure, quality requirement level, etc.).

As shown in FIG. 5, the imprint apparatus may detect the peeling defect when the peeling force (F) between the substrate and the film is greater than the first peeling defect detection level EL1. Generally, as the peeling force (F) increases, defects in the fine pattern may be more likely to occur because a stress of the resin formed on the substrate increases. For example, when the peeling force (F) according to a position (x) of the substrate is relatively great (e.g., curve NG), the peeling defect may more readily occur in the imprint process. When the peeling force (F) according to the position (x) is relatively small (e.g., curve OK), the imprint process may be normally performed.

The peeling defect may be detected by determining whether or not the peeling force between the film and the substrate exceeds the peeling force limit value by using (e.g., by monitoring) the first pressure of the pressure roller sensed by the pressure sensor. Thus, because the peeling defect may be determined according to the tension of the film in the first direction D1 (e.g., the third pressure with which the tension of the film is applied to the pressure roller in the first direction D1), the peeling defect detection level can be set by adjusting the tension of the film using the tensioner and/or by adjusting the peeling angle by moving the idle roller.

Therefore, the imprint apparatus may efficiently detect the peeling defect by setting the peeling defect detection level in consideration of a quality requirement level. For example, the peeling defect detection level may be set to the second peeling defect detection level EL2 by increasing the tension of the film and/or by increasing the peeling angle to less-strictly detect the peeling defect compared to the first peeling defect detection level EL1. The peeling defect detection level may be set to the third peeling defect detection level EL3 by decreasing the tension of the film and/or by decreasing the peeling angle to more strictly detect the peeling defect compared to the first peeling defect detection level EL1.

In one example embodiment, the idle roller may be moved in a first direction and/or a second direction orthogonal to the first direction to adjust the desired peeling angle based on the peeling defect detection level. As shown in FIG. 6, when the peeling defect detection level is set to the first peeling defect detection level EL1, the idle roller 151 may be spaced from the pressure roller 141 by a first height H1 in the first direction D1 and by a first width W1 in the second direction D2. In this case, the peeling angle may be the first angle A1. In another example, as shown in FIG. 7, the peeling defect detection level may be set to the second peeling defect detection level EL2 that is greater than the first peeling defect detection level EL1 by moving the idle roller 151 in the second direction D2. The idle roller 151 may be spaced from the pressure roller 141 by the first height H1 in the first direction D1 and by a second width W2 that is smaller than the first width W1 in the second direction D2. In this case, the peeling angle may be a second angle A2 that is greater than the first angle A1. In another example, as shown in FIG. 8, the peeling defect detection level may be set to the second peeling defect detection level EL2 by moving the idle roller 151 in the first direction D1. The idle roller 151 may be spaced from the pressure roller 141 by a second height H2 that is greater than the first height H1 in the first direction D1 and by the first width W1 in the second direction D2. In this case, the peeling angle may be a third angle A3 that is greater than the first angle A1.

Figure 9:
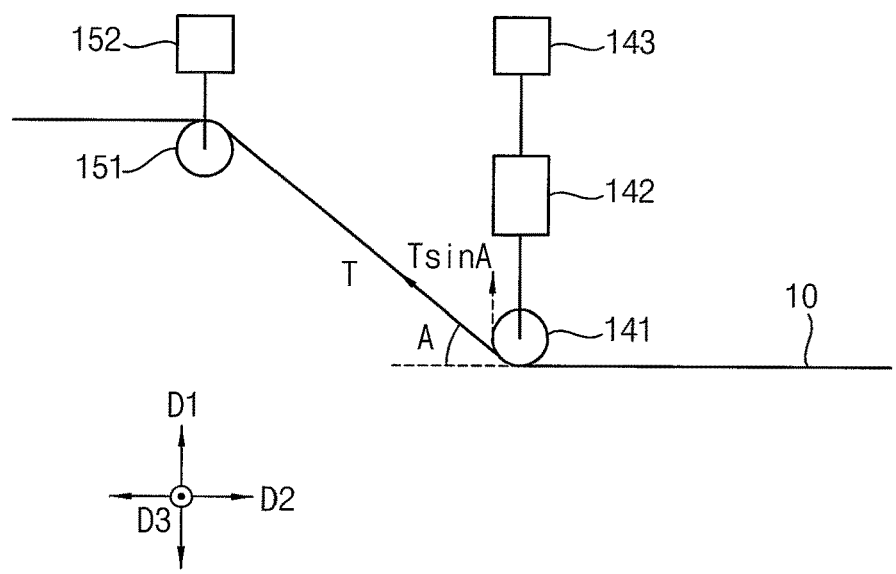
FIGS. 9 and 10 are diagrams for describing an example of a method of determining whether or not a peeling defect occurs.
Figure 10:
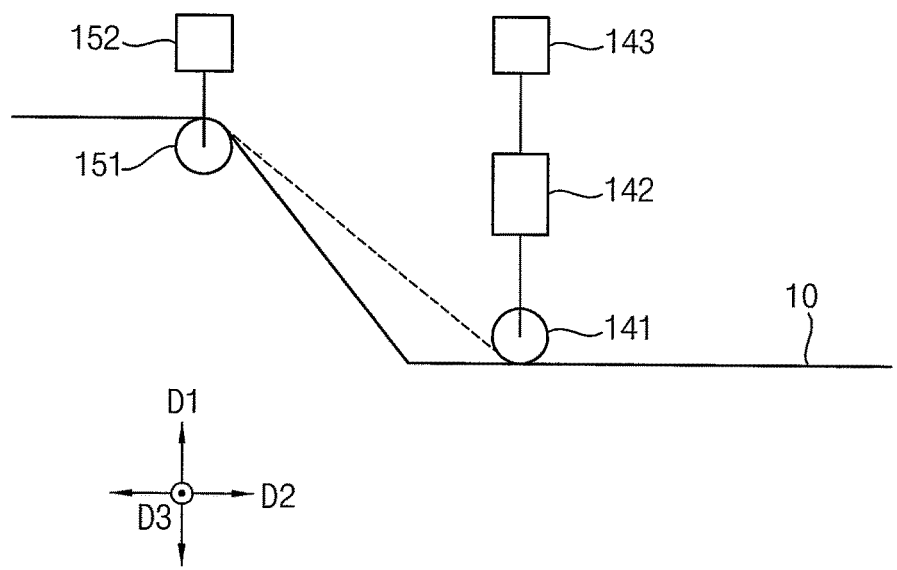

FIGS. 9 and 10 are diagrams for describing an example of a method of determining whether or not a peeling defect occurs.

Referring to FIGS. 9 and 10, the imprint apparatus may determine whether or not the peeling force (F) exceeds the peeling defect detection level (e.g., the peeling force limit value T sin A) based on the first pressure sensed by the pressure sensor. Accordingly, the imprint apparatus can inspect the quality defect of the imprint process.

For example, the imprint apparatus may sense the first pressure applied to the pressure roller 141 in the first direction D1. The imprint apparatus may detect the peeling defect by comparing the sensed first pressure with a resultant force of a second pressure and a third pressure. The second pressure corresponds to a pressure with which the pressure roller 141 presses the film 10 in the first direction D1. The third pressure corresponds to a pressure (i.e., T sin A) with which the tension T of the film 10 is applied to the pressure roller 141 in the first direction D1 (e.g., a vertical direction). For example, the imprint apparatus may determine whether or not the defect occurs according to whether or not [Equation 1] is satisfied.

$$P2+T\sin A-TH < P1 < P2+T\sin A+TH \quad \text{Equation 1:}$$

where, P1 indicates the first pressure sensed by the pressure sensor, P2 indicates the second pressure with which the pressure roller presses the film in the first direction by the first actuator, T indicates the tension of the film, A indicates the peeling angle, and TH indicates an error tolerance value.

As shown in FIG. 9, in a state in which the film 10 is normally peeled from the substrate 20 (i.e., in a normal state), the peeling force between the film 10 and the substrate 20 may be smaller than the tension of the film 10 in the vertical direction (i.e., T sin A). In this case, the film 10 is partially wound on the pressure roller 141 while the film 10 is peeled from the substrate 20. Accordingly, the first pressure of the pressure roller 141 sensed by the pressure sensor 142 may correspond to a resultant force of a pressure (e.g., the second pressure) with which the first actuator 143 presses the pressure roller 141 in the first direction D1 and the third pressure (i.e., T sin A) with which the tension T of the film 10 presses the pressure roller 141 in the first direction D1.

As shown in FIG. 10, the peeling force between the film 10 and the substrate 20 may be greater than the tension (i.e., T sin A) of the film 10 in the first direction D1 at a position of the pressure roller 141 in a state in which the film 10 is abnormally peeled from the substrate 20 (i.e., in an abnormal state). In this case, the film 10 may be peeled off of the substrate 20 at a position spaced from the pressure roller 141 without being wound onto the pressure roller 141. Because a force from the film 10 (i.e., the tension T of the film 10) may be not applied to the pressure roller 141, the first pressure of the pressure roller 141 sensed by the pressure sensor 142 may correspond to a force (i.e., the second pressure) with which the first actuator 143 presses the pressure roller 141 in the first direction D1.

Therefore, the imprint apparatus can detect the peeling defect based on the first pressure of the pressure roller 141 and monitor whether or not the imprint process is normally performed.

Figure 11:
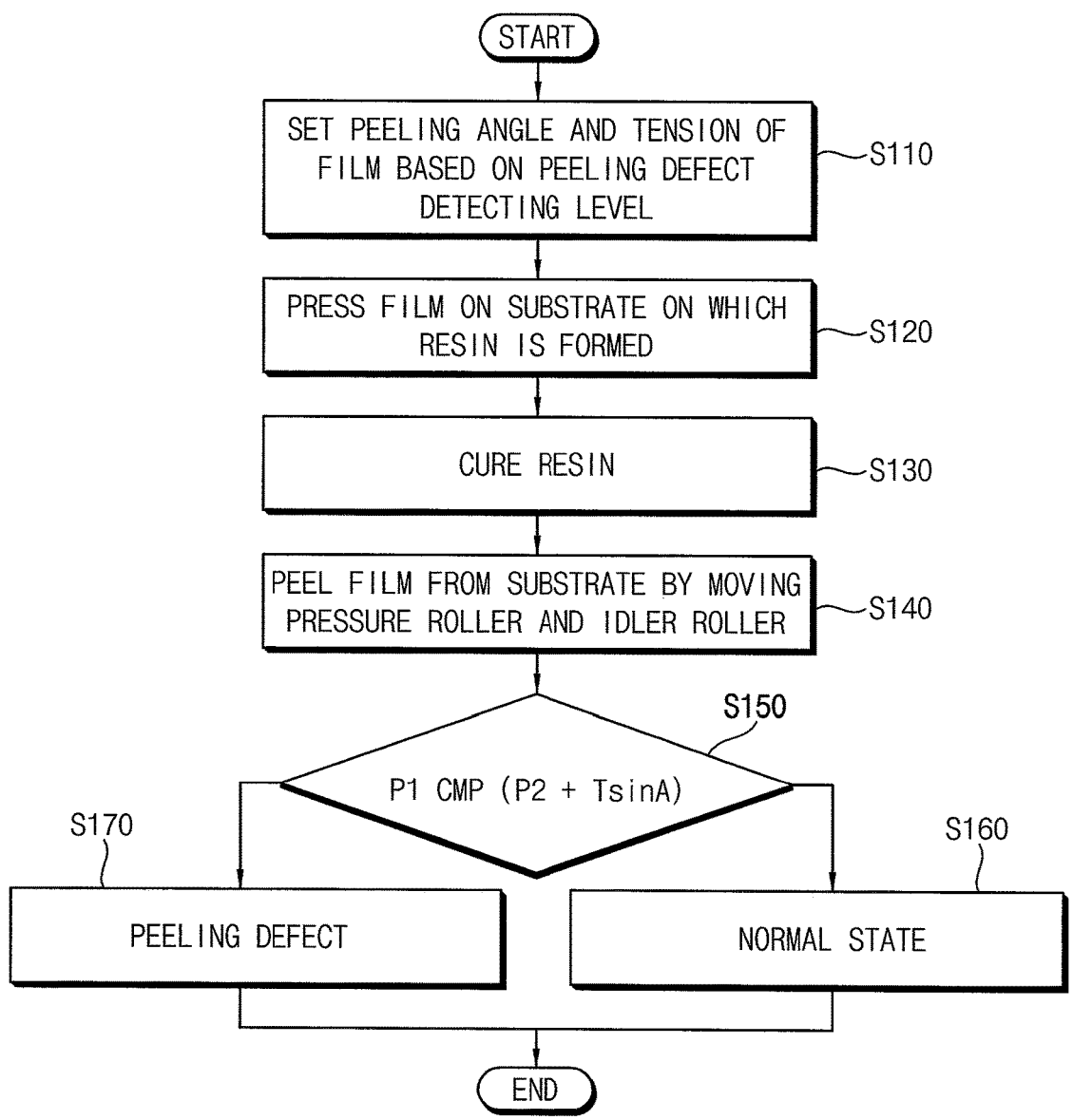
FIG. 11 is a diagram illustrating a method of detecting a peeling defect according to example embodiments.

FIG. 11 is a diagram illustrating a method of detecting a peeling defect according to example embodiments.

Referring to FIG. 11, the method may detect the peeling defect based on the pressure of the pressure roller sensed by using the pressure sensor, thereby increasing detection efficiency for defects of fine patterns formed on the substrate.

For example, the peeling defect detection level may be set, and the peeling angle at which the film is peeled from the substrate and/or the tension of the film may be set based on the peeling defect detection level (S110). Thus, the peeling defect detection level may be set in consideration of an imprint process material, a quality requirement level, etc. The peeling angle and/or the tension of the film may be adjusted according to the peeling defect detection level. For example, the tension of the film and/or the peeling angle may be increased to less-strictly inspect the peeling defect flexibly. On the other hand, the tension of the film and/or the peeling angle may be decreased to more-strictly inspect the peeling defect.

The film including the pattern may be pressed on the substrate on which the resin is formed (S120). For example, the film may be pressed on the substrate by moving the pressure roller and a roller supporting the film concurrently, simultaneously, or sequentially in the first direction.

The resin may be cured while the film is pressed on the substrate (S130). For example, when a photo-curable resin is formed on the substrate, the resin can be cured by irradiating the substrate with ultraviolet light. Thus, the resin can be cured in a shape corresponding to the pattern of the film.

The film may be peeled from the substrate by moving the pressure roller and the idle roller (S140), and then, the fine pattern corresponding to the pattern of the film may be formed on the substrate. The pressure roller and the idle roller may be moved in the second direction to peel the film from the substrate. In one example embodiment, the pressure roller and the idle roller may be concurrently (or simultaneously) moved, and a distance between the pressure roller and the idle roller may be constantly maintained while the film is peeled from the substrate. For example, the peeling angle at which the film is peeled from the substrate may be constantly maintained by integrally moving the pressure roller and the idle roller. Accordingly, the fine pattern may have a uniform quality.

While the film is being peeled from the substrate, the peeling defect may be inspected by comparing the first pressure P1 of the pressure roller and a resultant force of a pressure (e.g., the second pressure P2) with which the first actuator (or the pressure roller) presses the film in a first direction and a tension (e.g., the third pressure T sin A) of the film applied to the pressure roller in the first direction (S150). In one example embodiment, it is determined whether or not a difference between the first pressure and the resultant force of the second pressure and the third pressure is within an error range to detect the peeling defect. For example, it is determined whether or not the defect occurs according to [Equation 1] above.

When the difference between the first pressure and the resultant force of the second pressure and the third pressure is within the error range, it may be determined that the imprint process is normally performed (S160). When the difference between the first pressure and the resultant force of the second pressure and the third pressure deviates from the error range, it may be determined that the imprint process is not performed normally (S170). In one example embodiment, a peeling speed of the film may be decreased when the peeling defect is detected. As the peeling speed increases, more defects may occur in the fine pattern transferred to the substrate due to cracks generated in the pattern of the film. Therefore, when the peeling defect is detected, the peeling speed of the film may be decreased such that defects in the imprint process are not generated or fewer defects in the imprint process are generated. In addition, the imprint apparatus may determine that an error occurs in the imprint process and may stop the operation of the imprint apparatus when the peeling defect is continuously or repeatedly detected while the pressure roller is moved over a distance (e.g., over a predetermined distance).

Therefore, in the method of detecting the peeling defect in the imprint apparatus, the imprint quality may be inspected by a simple method using only the pressure sensor without additional equipment, such as a CCD camera or the like. In addition, it is possible to inspect fine defects of nano-sized patterns by setting the peeling defect detection level.

Although an imprint apparatus and a method of detecting a peeling defect of the imprint apparatus according to example embodiments have been described with reference to figures, those skilled in the art will readily appreciate that many modifications are possible in the example embodiments without materially departing from the aspects and features of the present inventive concept. For example, although the example embodiments describe that the resin is a photo-curable resin cured by ultraviolet light, the resin is not limited thereto. For example, the resin may be a thermosetting resin cured by heat.

The present inventive concept may be applied to an imprint apparatus. For example, the present inventive concept may be applied to an imprint apparatus for manufacturing display devices, an imprint apparatus for manufacturing memory devices, etc.

The foregoing is illustrative of example embodiments and is not to be construed as limiting thereof. Although a few example embodiments have been described, those skilled in the art will readily appreciate that many modifications are possible in the example embodiments without materially departing from the novel aspects and features of the present inventive concept. Accordingly, all such modifications are intended to be included within the scope of the present inventive concept as defined in the claims and their equivalents. Therefore, it is to be understood that the foregoing is illustrative of various example embodiments, the present invention is not to be construed as limited to the specific example embodiments disclosed, and that modifications to the disclosed example embodiments, as well as other example embodiments, are intended to be included within the scope of the appended claims and their equivalents.

What is claimed is:

1. An imprint apparatus comprising:
a pressure roller configured to press a film onto a substrate;
an idle roller spaced from the pressure roller, the idle roller and the pressure roller being configured to peel the film from the substrate;
a pressure sensor connected to the pressure roller and configured to sense a pressure applied to the pressure roller; and
a controller configured to detect a peeling defect based on the pressure.

2. The imprint apparatus of claim 1, wherein the pressure constitutes a first pressure, and
wherein the controller detects the peeling defect by comparing the first pressure with a resultant force of a second pressure and a third pressure, the second pressure being a pressure with which the pressure roller presses the film in a first direction, the third pressure being a pressure with which a tension of the film is applied to the pressure roller in the first direction.

3. The imprint apparatus of claim 1, wherein the controller is configured to decrease a peeling speed of the film when the peeling defect is detected.

4. The imprint apparatus of claim 1, wherein the controller is configured to adjust at least one of a peeling angle at which the film is peeled from the substrate and a tension of the film based on a peeling defect detection level.

5. The imprint apparatus of claim 4, wherein the idle roller moves in at least one of a first direction and a second direction orthogonal to the first direction to adjust the peeling angle.

6. The imprint apparatus of claim 1, wherein the pressure roller and the idle roller are configured to concurrently move such that a distance between the pressure roller and the idle roller is maintained while the film is peeled from the substrate.

7. The imprint apparatus of claim 1, further comprising:
a film supply roller configured to supply the film to the pressure roller;
a film recovery roller configured to recover the film from the idle roller; and
a tensioner between the idle roller and the film recovery roller, the tensioner being configured to control a tension of the film.

8. An imprint apparatus comprising:
a pressing portion comprising a pressure roller configured to press a film onto a substrate and a pressure sensor configured to sense a first pressure of the pressure roller;
an idle portion configured to move to adjust a peeling angle at which the film is peeled from the substrate;
a tensioner configured to control a tension of the film; and
a controller configured to detect a peeling defect based on the pressure.

9. The imprint apparatus of claim 8, wherein the pressure constitutes a first pressure,
wherein the pressing portion further comprises:
a first roller support member configured to support the pressure roller; and
a first actuator configured to control the pressure roller such that the pressure roller presses the film in a first direction with a second pressure, and
wherein the pressure sensor is between the first roller support member and the first actuator.

10. The imprint apparatus of claim 9, wherein the controller is configured to detect the peeling defect by comparing the first pressure with a resultant force of the second pressure and a third pressure, the third pressure being a pressure with which the tension of the film is applied to the pressure roller in the first direction.

11. The imprint apparatus of claim 8, wherein the controller is configured to decrease a peeling speed of the film when the peeling defect is detected.

12. The imprint apparatus of claim 8, wherein at least one of the peeling angle and the tension of the film is adjusted based on a peeling defect detection level.

13. The imprint apparatus of claim 12, wherein the idle portion comprises:
an idle roller spaced from the pressure roller and configured to peel the film from the substrate; and
a second actuator configured to move the idle roller in at least one of a first direction and a second direction orthogonal to the first direction to adjust the peeling angle.

14. The imprint apparatus of claim 13, wherein the pressure roller and the idle roller are configured to be concurrently moved such that a distance between the pressure roller and the idle roller is maintained while the film is peeled from the substrate.

* * * * *